INVENTORS
FRED BARSON
WALTER E. MUTTER

BY Everett A. Gartrell

ATTORNEY

Aug. 8, 1967 F. BARSON ETAL 3,335,340

COMBINED TRANSISTOR AND TESTING STRUCTURES
AND FABRICATION THEREOF

Filed Feb. 24, 1964 2 Sheets-Sheet 2

United States Patent Office 3,335,340
Patented Aug. 8, 1967

3,335,340

COMBINED TRANSISTOR AND TESTING STRUCTURES AND FABRICATION THEREOF

Fred Barson, Wappingers Falls, and Walter E. Mutter, Poughkeepsie, N.Y., assignors to International Business Machines Corporation, New York, N.Y., a corporation of New York Filed Feb. 24, 1964, Ser. No. 346,834
4 Claims. (Cl. 317—235)

The present invention is directed to combined transistor and testing structures and the methods of fabricating them. More particularly, the invention relates to a double-diffused transistor array and testing structure which permits a direct electrical measurement to be made which is representative of the sheet resistance and the effective base width of the transistors.

Critical parameters in the fabrication of transistors by double-diffusion techniques are the control of the effective width of the base region under the emitter region and the active impurity concentration in that base region. By effective base width we mean the thickness of the active base region traversed by the carriers flowing in a direct path from the emitter region to the collector region. Those parameters are particularly critical in the fabrication of high speed transistors which have extremely small base widths such as about 1 micron or less, wherein base-width control of the order of 0.1 micron or less may be desired.

Heretofore in the fabrication of diffused transistors, the measurement of the base widths thereof has been a slow, difficult and relatively costly undertaking. A pilot or sample wafer was subjected to the prescribed sequence of diffusion steps practiced in the fabrication of a transistor and then the base width was determined by beveling, staining the junction regions and making bevel angle measurements and microscopic measurements of distance on the beveled surface. When the measurements of the sample prove to be within limits, the diffusion operation work was continued using production wafers. However, when the measurements obtained were outside of established tolerances, adjustment in processing procedures were made until the units came within prescribed limits. The results obtained by such cut and try procedures have left much to be desired from a manufacturing standpoint, particularly in connection with mass production wherein arrays of several hundred transistors are fabricated simultaneously on a single wafer.

It is an object of the present invention, therefore, to provide a new and improved method of fabricating transistors which avoids one or more of the above-mentioned disadvantages of prior fabrication techniques.

It is another object of the invention to provide new and improved method of fabricating large batches of transistors which permits a convenient monitoring of a parameter thereof to establish whether the base widths are within prescribed limits.

It is a further object of the invention to provide a new and improved method of fabricating a transistor and making a measurement representative of the effective base width thereof.

It is also an object of the invention to provide a new and improved combined transistor and testing structure which facilitates a quick and accurate determination of the sheet resistance of the base regions of the transistor.

It is yet another object of the present invention to provide a new and improved combined transistor array and testing structure which permits making quick electrical measurements that provide a direct indication representative of the base widths of the transistors in the array.

It is another object of the invention to provide a new and improved combined transistor array and testing structure which eliminates a need for tedious beveling, staining, bevel angle measurements and microscopic measurements of distances on the bevel to determine whether the base widths of the transistors are within prescribed production limits.

It is still another object of the invention to provide a new and improved method of fabricating simultaneously a plurality of identical transistors and making a measurement representative of a base-region parameter of individual transistors thereof.

In accordance with a particular form of the invention, a combined transistor and testing structure comprises a semiconductor body of one conductivity type and first and second diffused members of the opposite conductivity type and the same impurity level disposed in spaced portions of that body. The combined structure further includes a diffused emitter region of the aforesaid one conductivity type for the transistor disposed in a portion of the first member, establishing the remainder thereof as the base region of the transistor between the emitter region and the body wherein the latter constitutes the collector region of the transistor, and further establishing the effective width of the base region. The combined structure also includes a diffused third member of the aforesaid one conductivity type having the same impurity concentration profile as the emitter and disposed in and extending completely across an intermediate portion of the second member and establishing the effective width of the intermediate portion between the third member and the body which is equal to the aforesaid width of the base region. The second and third members form the testing structure for use in measuring the effective base width of the transistor.

Also in accordance with the invention, in the fabrication of a transistor, the method of forming the emitter and base regions thereof while forming a testing structure for use in measuring the effective width of the base region comprises simultaneously diffusing into spaced portions of the semiconductor body of one conductivity type a conductivity-determining impurity to form first and second members of the opposite conductivity type and the same impurity level. The method further includes simultaneously diffusing into a portion of the first member and an intermediate portion of the second member a conductivity-directing impurity (a) to form the emitter region of the transistor of the aforesaid one conductivity type, (b) to establish the effective width of the base region of the transistor between the emitter region and the body wherein the latter constitutes the collector region of the transistor, (c) to form in the intermediate portion of the second member and completely extending thereacross a third member of the aforesaid one conductivity type and the same impurity concentration profile as the emitter, and (d) to establish an effective width of the aforesaid intermediate portion remaining between the third member and the body which is equal to the width of the base region.

Further in accordance with the present invention, the method of fabricating a transistor and measuring the effective base width thereof comprises simultaneously diffusing into spaced portions of a semiconductor body of one conductivity type a conductivity-determining impurity to form first and second members of the opposite type and the same impurity level. The method also includes simultaneously diffusing into a portion of the first member and an intermediate portion of the second member a conductivity-directing impurity (a) to form the emitter region of the transistor of the aforesaid one conductivity type (b) to establish the effective width of the base region of the transistor between the emitter region and the body wherein the latter constitutes the collector region of the transistor, (c) to form in the aforesaid intermediate portion of the second member and completely extending thereacross a third member of the one conductivity type and the same impurity concentration profile as the emitter, and (d) to establish an effective width of the intermediate portion remaining between the third member and the body which is equal to the width of the base region. The method further includes connecting a current source across the extremities of the remaining intermediate portion so as to apply a voltage less than the emitter-base breakdown voltage of the transistor, and utilizing the magnitudes of the voltage and current flow through the remaining intermediate portion to determine the resistance of the remaining portion and the effective base width of the transistor.

The foregoing and other objects, features and advantages of the invention will be apparent from the following more particular description of a preferred embodiment of the invention, as illustrated in the accompanying drawings.

*Description of combined transistor and testing structure*

Figure 1:
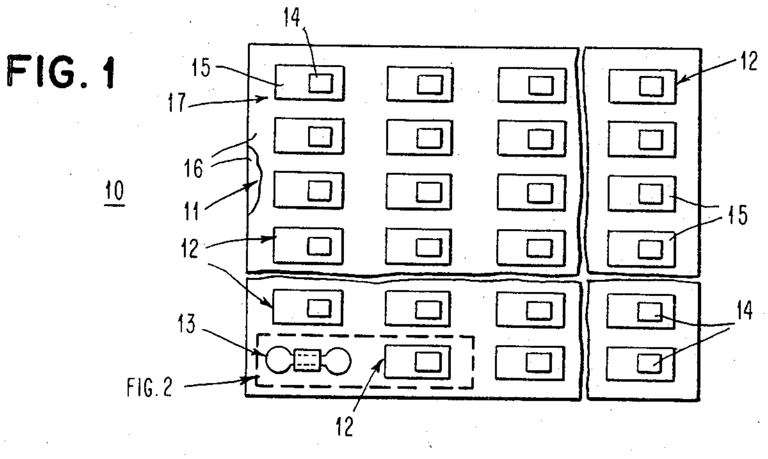
FIG. 1 is a plan view of a combined transistor and testing structure which includes therein a plurality of identical transistors.

Referring now to the drawings, there is represented diagrammatically in FIG. 1 a plan view of a combined transistor and testing structure 10 which includes a semiconductor body or wafer 11 of a material such as silicon. This wafer may be employed in the simultaneous fabrication of a plurality of transistors 12, 12, such as an array of several hundred thereof, and at least one testing structure 13. To simplify the representation, only the upper surface portions of the emitter, base and collector regions 14, 15 and 16, respectively, of a limited number of transistors have been shown. In a particular embodiment, the wafer or body 11 may be about ¾ inch long, ¾ inch wide and 10 mils thick. It will be understood, however, that the dimensions which are given are representative, and also that semiconductor materials other than silicon may be employed. For some applications, it may be desirable to incorporate several testing structures in the semiconductor body, for example, one in each corner thereof or one for each transistor. Usually a few or even one will suffice.

Figure 2:
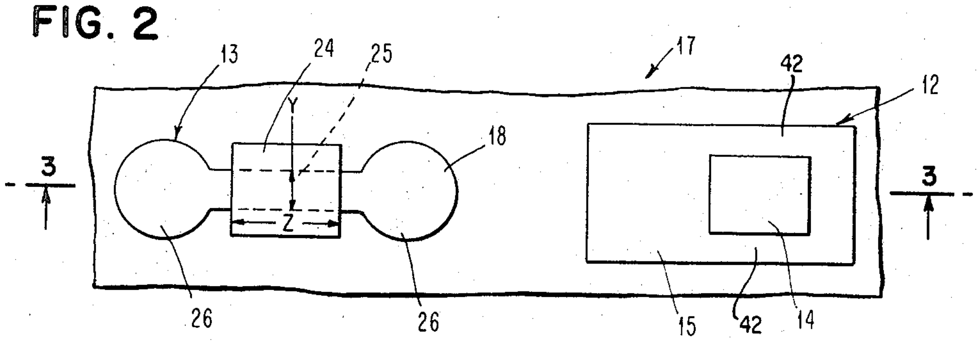
FIG. 2 is a greatly enlarged view of a portion of the FIG. 1 structure showing the testing portion and an adjacent transistor.
Figure 3:
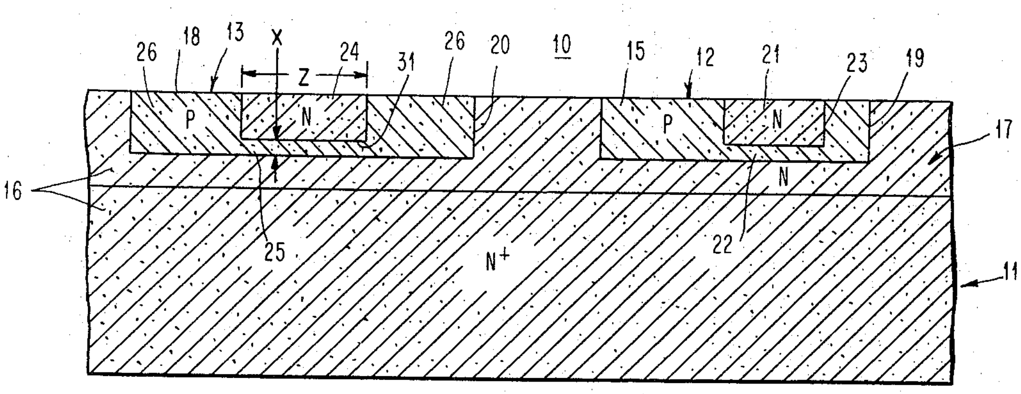
FIG. 3 is a sectional view of the FIG. 2 structure taken on the line 3—3.

In FIG. 2 there is represented to a greatly enlarged scale a single transistor 12 and the adjacent testing structure 13 appearing at a corner of the overall structure represented in FIG. 1. FIG. 3 represents a sectional view on the line 3—3 of FIG. 2 showing additional details. For convenience of representation and explanation, a passivating layer of a suitable material such as silicon oxide, usually in the form of the dioxide, has been omittted from the upper surface of the structure but will be considered subsequently. The semiconductor body 11 is of one conductivity type and, for the purpose of this description will be deemed to be of the N-type. Body 11 comprises a highly doped N-type substrate, designated in a conventional manner by a symbol $N^+$, which has epitaxially deposited thereon in the well known manner a high resistivity N-type layer 17. It will be understood, however, that for some applications the epitaxial layer may be omitted and only an N-type body or wafer 11 may be employed.

The combined transistor and testing structure 10 also includes first and second diffused members 15 and 18, which are of the opposite or P-conductivity type and of the same impurity level, disposed in spaced portions of the semiconductor body 11. Member 15 constitutes the overall base region of the transistor 12. At this point it should be understood that although the description of the combined transistor and testing structure is being developed on the basis of a single transistor 12 and its associated testing structure 13, it is the usual manufacturing practice to fabricate simultaneously with the testing structure a plurality of transistors in the form of a large array thereof. Members 15 and 18 are created simultaneously in the N-type layer 17 by the selective diffusion in a conventional manner of a P-type impurity such as boron through an apertured diffusion mask (not shown) of a material such as silicon dioxide. This also forms a pair of PN junctions 19 and 20 which have portions that extend to the upper surface or layer 17. Junction 19 constitutes the base-collector junction of the transistor 12 under consideration.

Briefly, the diffusion mask may be formed in the manner explained hereinafter. That mask may be derived from the layer 17 by heating the semiconductor structure to between 900–1400° C. in an oxidizing atmosphere saturated with water vapor or steam to form an oxide film. Patent 2,802,706 to Derick et al., granted Aug. 14, 1957, and entitled, "Oxidizing of Semiconductor Surfaces for Control Diffusion" describes one such treatment. Although the exact chemical composition of the oxide film forming the diffusion mask is not known, it is believed that silicon dioxide is its major constituent.

Alternatively, an inert adherent coating or film which is believed to be mostly silicon dioxide may be formed on the surface of the layer 17 by heating the semiconductor structure in the vapors of an organic siloxane compound at a temperature below the melting point of the structure but above that at which the siloxane decomposes, so that an inert film of silicon dioxide coats the desired surface. For example, the structure may be heated for 10–15 minutes at approximately 700° C. in a quartz furnace containing triethoxysilane, using argon or helium as the carrier gas to sweep the siloxane fumes through the furnace. Since experience has indicated that silicon dioxide films made by the thermal decomposition of an organic siloxane compound are somewhat less dense than those grown in an oxidizing atmosphere, a somewhat thicker film of the former is ordinarily employed. Patent 3,089,793 of Eugene L. Jordan and Daniel J. Donohue, granted May 14, 1963, and entitled, "Semiconductor Devices and Methods of Making Them" describes procedures for making such films, removing selected portions thereof, and diffusing conductivity-directing impurities through the openings established in those films or apertured masks to form PN junctions.

Suitable apertures are formed at predetermined locations in the silicon dioxide film by conventional photoengraving techniques. In the manner well known in the art, a photoengraving resist (also not shown) is placed over the silicon dioxide film and the resist is then exposed through a master photographic plate having opaque areas corresponding to the regions from which the oxide film is to be removed. In the photographic development, the unexposed resist is removed and a corrosive fluid is employed to remove the oxide film from the now exposed regions while the developed resist serves as a mask to prevent the chemical etching of the oxide areas that are to remain on the epitaxial layer 17. The resist is chemically removed and the impurities are then diffused through the apertures in the mask in a manner which is well known in the art.

Also in the manner well known in the art in connection with the fabrication of planar transistors, a second apertured diffusion mask (not shown) is reformed on the upper surface of the combined transistor and testing structure 10. Then an N-type impurity such as phosphorus is selectively diffused through the apertures of the mask to establish a diffused emitter region 21 of the one or N-type conductivity for the transistor disposed in a portion of the first member 15. This operation also establishes as the effective base region of the transistor 12, in so far as emitter-collector current is concerned, the remainder 22 of the member 15 existing between the emitter region 21 and the layer 17. The latter and the low-resistivity N+ semiconductor body constitute the collector region of the transistor. It will also be seen from FIG. 3 that the diffusion operation which creates the emitter region 21 and the emitter-base junction 23 simultaneously establishes the width of region 22 which is here considered as being the effective width of the base region. The diffusion operation under consideration is further effective to form a diffused third member 24 of the one or N-conductivity type which has the same impurity concentration profile as the emitter region 21. Member 24 is disposed in and extends completely across the intermediate portion 25 (see also FIG. 2) of the P-type second member 18. The creation of member 24 in turn establishes the effective width X of the intermediate portion 25 between the third member 24 and body or layer 17, which width is equal to the width of the effective base region 22.

As represented in FIG. 2, the P-type second member 18 of the testing structure 13 preferably includes a pair of enlarged end portions 26, 26 separated by the intermediate portion 25 so that a plan view thereof has the configuration of a dumbbell. The geometry of the end portions is not critical, the important consideration being that they present a large surface area to facilitate locating testing probes thereon without difficulty and that their volume being sufficient that their conductivity is very high in relation to that of the intermediate portion 25. The length Z of the intermediate portion 25 may be about twice its other dimension Y in the same plane. It is understood that Z and Y are normal to each other as shown in FIGURE 2. That length ordinarily is in the range of 1–20 times its other dimension normal to that length. Portions 24, 25 and 26, 26 form the testing structure 13 to be used in determining the effective base width of the transistor 12.

Figure 4:
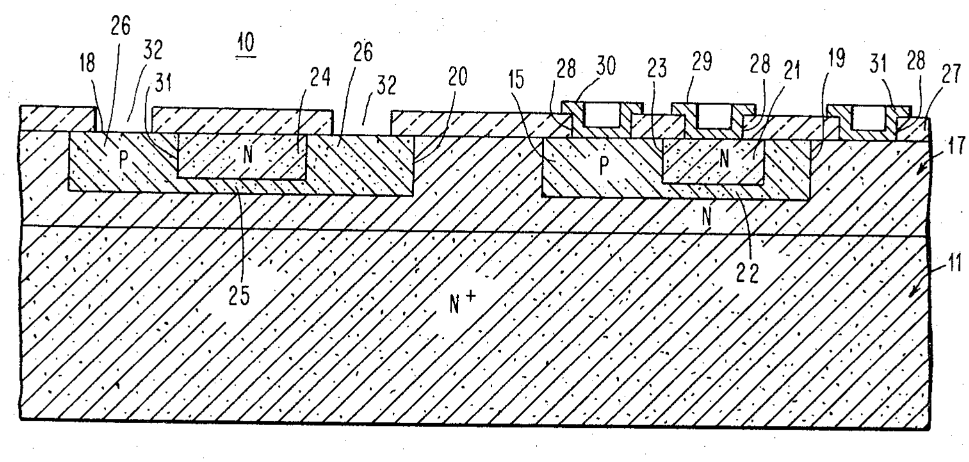
FIG. 4 is a view similar to FIG. 3 showing a passivating layer on the critical surface of the structure and electrical connections to the transistor.

Referring now to FIG. 4 of the drawings, the combined transistor and testing structure 10 there represented corresponds to that shown in FIG. 3 except for the passivating silicon oxide coating 27 which appears on the upper surface of the structure covering the various PN junctions that come to the surface. This coating is normally formed after the final diffusion operation but has been omitted from the preceding figure to simplify the representations thereof. Apertures 28, 28 have been formed in the coating over predetermined portions of the upper surface of the emitter, base and collector regions 14, 15 and 17 of the transistor and metallic coatings 29, 30 and 31 have been applied to those respective regions in a conventional manner to form emitter, base and collector terminals for the transistor 12. Similarly, openings 32, 32 are established in the coating over the enlarged portions 26, 26 of the testing structure 13 to facilitate the application of testing probes 33, 33 thereto (see FIG. 5) for the purpose of making electrical measurements.

Figure 5:
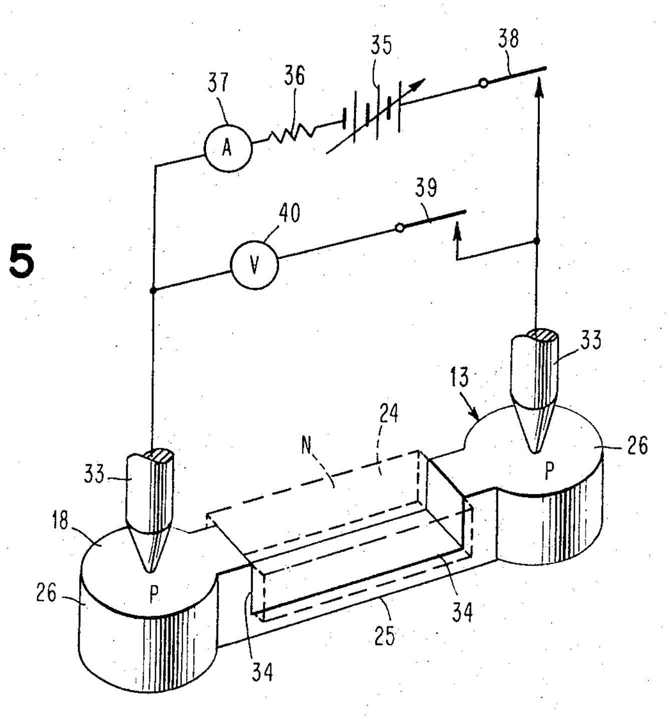
FIG. 5 is a diagrammatic representation of the semiconductor region under test and a simplified arrangement for making resistance tests.

In making a measurement of the resistance of the intermediate portion 25 of the testing structure of pattern 13, the test probes 33, 33 of a suitable testing apparatus to be described subsequently are applied to the exposed surfaces of the regions 26, 26. To facilitate the understanding of the operation, in FIG. 5 there is represented in perspective the P-type member 25, 26, 26 being tested, that member being shown as removed from the N-type epitaxial layer 27 which supports it. This representation is considered to be permissible and accurate electrically since the P-type member 25, 26, 26 is effectively isolated from the layer 17 by the presence of the very high resistance barrier or junction 20. The diffused N-type intermediate member 24 is represented in broken-line construction in FIG. 5. It too is electrically isolated from the P-type intermediate portion 25 by another very high resistance barrier or junction 34. Relatively simple testing apparatus may be employed as shown in FIG. 5. A constant-current source comprising a battery 35 and a high impedance resistor 36 are connected to the probes through the series combination of a current meter 37 and a switch 38. Also connected between the probes through switch 39 is a high-resistance voltmeter 40 which may be of the vacuum-tube type. The voltage applied to portions 26, 26 by probes 33, 33 should be less than the emitter-base breakdown voltage of the transistor 12 and as low as is practicable to obtain the best measurements. A voltage in the order of a few tenths of a volt has proved to be useful. To high a voltage may create a depletion layer in the intermediate portion 25 near the negatively poled probe. This would adversely affect the accuracy of the meter readings by its tendency to pinch off the flow of current by electrically reducing the width of the P-type intermediate portion 25 between the N-type portion 24 and the N-type epitaxial layer 17.

The conductivity and the geometry of the enlarged P-type portions 26, 26 are such that they present a very low resistance with respect to that of the very thin intermediate portion 25 that is connected therebetween. Accordingly, it has been found that the resistance of portions 26, 26 may be neglected with reference to the resistance of the portion 25 that is being measured. The previously described diffusion operations which form the intermediate portion 25 very accurately establish the dimensions of that portion and also the critical dimensions of the remainder portion 22 constituting the effective base region of the transistor 12. For the purpose of the explanation which follows, it will be assumed that the length of the intermediate portion 25 is twice its width measured in the same horizontal plane.

*Measurement of base width of transistor base region*

The switch 38 is closed and the magnitude of the current suppled by the constant-current source is adjusted to a predetermined value which may be indicated by the ammeter 37. Then, the switch 39 is closed and the magnitude of the voltage indicated by the voltmeter 40 is noted. The resistance R of the intermediate portion 25 may be determined from the well known relation $$R=\frac{V}{I}$$

where V is the voltage indicated by the voltmeter 40 and I is the current indicated by the ammeter 37. If the length of portion 25 is assumed to be twice its width measurement in the same horizontal plane, the quotient obtained by dividing the value of R by two will be the sheet resistance of portion 25, that is its resistance in ohms per square. If desired, the voltmeter 40 may be calibrated directly in terms of sheet resistance for the conditions wherein the current is set at a predetermined value and the length and width dimensions of region 25 bear a predetermined relationship such as the 2 to 1 relation mentioned above.

Experience has indicated that for the structure under consideration, the sheet resistance of the intermediate portion 25 affords a reliable indication which not only is representative of the thickness of that portion but also the thickness of the effective base region 25 of transistor 12. It will be observed from the geometry of the transistor of FIG. 2, that, because of the low resistance shunt paths 42, 42 between the right and left hand portions of the base region 15 on opposite sides of the emitter region 14, that one cannot make a direct measurement of the sheet resistivity of the effective base region 25. However, this can be accomplished by the prescribed measurement made for the intermediate portion 25 of the testing structure which has a thickness and composition identical with that of the region 22. This measurement is reliable for the plurality of transistors of the array. Hence it may constitute a simple, quick and direct production check for monitoring of the accuracy of the diffusion operations performed during the fabrication of an array of transistors to determine whether the base widths thereof are within prescribed production limits. With this improved structure and testing procedure, tedious beveling, staining, bevel angle measurements and microscopic measurements of distances on the bevel that heretofore were employed to measure base widths of transistors are eliminated.

Although a simple two probe method has been disclosed for determining the sheet resistance and the base width of transistors being fabricated, it will be understiood that other techniques such as the four probe method may be employed. Four probe measurement techniques are known in the semiconductor art and will not be described except to state that the four probes are arranged in a colinear relation, the outside probes being the current contacts and the inside pair being the potential probes.

While the invention has been particularly shown and described with reference to preferred embodiments thereof, it will be understood by those skilled in the art that various changes in form and details may be made therein without departing from the spirit and scope of the invention.

What is claimed is:

1. A combined transistor and testing structure comprising:

a semiconductor body of one conductivity type;

first and second diffused members of the opposite conductivity type disposed in spaced portions of said body, said first and second members having the same impurity level, and said second member including a pair of enlarged portions separated by an intermediate portion;

a diffused emitter region of said one conductivity type for said transistor disposed in a portion of said first member, establishing the remainder thereof as the base region of said transistor between said emitter region and said body wherein the latter constitutes the collector region of said transistor, and further establishing the effective width of said base region;

a diffused third member of said one conductivity type having the same impurity concentration profile as said emitter region and disposed in and extending completely across said intermediate portion of said second member and establishing the effective width of said intermediate portion between said third member and said body which is equal to said width of said base region; and further establishing an effective length for said intermediate portion which is in the range of 1–20 times its other dimension normal to said length;

said second and third members forming said testing structure for use in measuring the effective base width of said transistor.

2. A combined transistor and testing structure for transistors having a base region width of less than about one micron comprising:

a semiconductor body of one conductivity type;

first and second diffused members of the opposite conductivity type disposed in spaced portions of said body, said first and second members having the same impurity level, and said second member including a pair of enlarged portions separated by an intermediate portion;

a diffused emitter region of said one conductivity type for said transistor disposed in a portion of said first member, establishing the remainder thereof as the base region of said transistor between said emitter region and said body wherein the latter constitutes the collector region of said transistor, and further establishing the effective width of said base region;

a diffused third member of said one conductivity type having the same impurity concentration profile as said emitter region and disposed in and extending completely across said intermediate portion of said second member and establishing the effective width of said intermediate portion between said third member and said body which is equal to said width of said base region and further establishing an effective length for said intermediate portion which is at least twice its other dimension normal to said length;

said second and third members forming said testing structure for use in measuring the effective base width of said transistor;

said enlarged portions being of such size that their resistance is negligible in comparison to the resistance of said intermediate portion between said third member and said body, and that they may be easily contacted by test probes; and an insulating layer covering the surface of said testing structure with openings therein only to said enlarged portions.

3. A combined transistor and testing structure representing an intermediate product in the simultaneous fabrication of a plurality of transistors comprising:

a semiconductor body of one conductivity type;

a plurality of first diffused members and at least one second diffused member of the opposite conductivity type disposed in spaced portions of said body, said second member including a pair of enlarged portions separated by an intermediate portion; said first and second members having the same impurity level, and a corresponding plurality of diffused emitter regions of said one conductivity type for said transistors disposed in portions of said first member, establishing the remainder thereof as the base regions of said transistors between said emitter regions and said body wherein the latter constitutes the collector region of said transistors, and further establishing the effective width of said base regions;

a diffused third member of said one conductivity type having the same impurity concentration profile as said emitter regions and disposed in and extending completely across an intermediate portion of said second member and establishing the effective width of said intermediate portion between said third member and said body which is equal to said width of said base regions, and further establishing an effective length for said intermediate portion which is in the range of 1–20 times its other dimension normal to said length;

said second and third members forming said testing structure for use in measuring the effective base widths of said transistors; and said enlarged portions being of such size that their resistance is negligible in comparison to the resistance of said intermediate portion between said third member and said body, and that they may be easily contacted by test probes.

4. A combined transistor and testing structure representing an intermediate product in the simultaneous fabrication of a plurality of transistors having base region widths of less than about one micron comprising:

a semiconductor body of one conductivity type;

a plurality of first and at least one second diffused member of the opposite conductivity type disposed in spaced portions of said body, said first and second members having the same impurity level, and said second member including a pair of enlarged portions separated by an intermediate portion;

a corresponding plurality of diffused emitter regions of said one conductivity type for said transistor disposed in portions of said first member, establishing the remainder thereof as the base regions of said transistors between said emitter region and said body wherein the latter constitutes the collector region of said transistors, and further establishing the effective width of said base regions;

a diffused third member of said one conductivity type having the same impurity concentration profile as said emitter regions and disposed in and extending completely across said intermediate portion of said second member and establishing the effective width of said intermediate portion between said third member and said body which is equal to said width of said base regions and further establishing an effective length for said intermediate portion which is in the range of 1–20 times its other dimension normal to said length;

said second and third members forming said testing structure for use in measuring the effective base widths of said transistors; said enlarged portions being of such size that their resistance is negligible in comparison to the resistance of said intermediate portion between said third member and said body, and that they may be easily contacted by test probes; and an insulating layer covering the surface of said testing structure with openings therein only to said enlarged portions.

References Cited

UNITED STATES PATENTS

| | | | |
|---|---|---|---|
| 3,070,762 | 12/1962 | Evans | 330—70 |
| 3,183,128 | 5/1965 | Leistiko | 148—186 |
| 3,223,904 | 12/1965 | Warner et al. | 317—235 |

JOHN W. HUCKERT, *Primary Examiner.*

M. EDLOW, *Assistant Examiner.*